US006498493B2

(12) United States Patent
Kato

(10) Patent No.: US 6,498,493 B2
(45) Date of Patent: Dec. 24, 2002

(54) ELECTRIC POTENTIAL DETECTOR, DEVICE TESTER AND METHOD OF DETECTING ELECTRIC POTENTIAL

(75) Inventor: Shunsuke Kato, Tokyo (JP)

(73) Assignee: Advantest Corporation, Tokyo (JP)

( * ) Notice: Subject to any disclaimer, the term of this patent is extended or adjusted under 35 U.S.C. 154(b) by 35 days.

(21) Appl. No.: 09/753,710

(22) Filed: Jan. 4, 2001

(65) Prior Publication Data

US 2002/0067169 A1 Jun. 6, 2002

(30) Foreign Application Priority Data

Jan. 7, 2000 (JP) ....................................... 2000-001988

(51) Int. Cl.[7] ................................................ G01R 29/12
(52) U.S. Cl. .......................................... 324/457; 324/72
(58) Field of Search ................................ 324/457, 458, 324/72

(56) References Cited

U.S. PATENT DOCUMENTS 6,316,942 B1 * 11/2001 Horiguchi ................... 324/457

FOREIGN PATENT DOCUMENTS

JP 09-114148 * 5/1997

* cited by examiner

*Primary Examiner*—Christine K. Oda
(74) *Attorney, Agent, or Firm*—Rosenthal & Osha L.L.P.

(57) ABSTRACT

A control circuit 10 inputs a maximum value, which is read out of a resistor 22, to one of the input terminals of a comparator 14 by providing the maximum value to a D/A convertor 18 through a latch 16. The electric potential V, which is an object to be tested, is input to another input terminal of the comparator 14 through a hold circuit 12. The comparator 14 judges the magnitude of the value of the electric potential V by referring to the maximum value and outputs to the control circuit 10. The same operation is also performed for the minimum value. The pass/fail judgement is performed for judging whether the value of the electric potential V is within an allowable range by the comparison with the maximum value and the minimum value. Furthermore, the control circuit 10 performs an A/D conversion of the electric potential V by reading out data D1–Dn from the resistor 20 one after another to gradually change the reference of a comparison. The same comparator 14 performs the pass/fail judgement and the A/D conversion, and thus the inconsistency does not occur.

7 Claims, 14 Drawing Sheets

ELECTRIC POTENTIAL DETECTOR, DEVICE TESTER AND METHOD OF DETECTING ELECTRIC POTENTIAL

This patent application claims priority based on Japanese patent application, 2000-1998 filed on Jan. 7th, 2000.

BACKGROUND OF THE INVENTION

1. Field of Invention

This invention relates to an electric potential detector, a device tester, and a method of detecting electric potential.

2. Description of Related Art

A device tester has to accurately measure a voltage output from a device to secure a reliability of the testing. Moreover, an electric current that flows into the device and the electric current that flows out of the device also have to be measured accurately.

FIG. 1 shows a conventional electric potential detector. The electric potential V that is input from an input terminal 30 is input to both an A/D convertor 810 and analog comparators 820 and 830. Each of the A/D convertor 810 and the comparators 820 and 830 are comprised for performing a determination of the digital value of the electric potential V and a judgement (pass/fail judgement) of whether the electric potential V exists within an allowable range. The pass/fail judgement can be known by comparing the maximum and minimum value of the allowable range and the value of the electric potential V.

Details of the pass/fail judgement will be explained. A maximum value of an allowable range of an electric potential is provided to the plus side of an input terminal of the comparator 820 from the D/A convertor 840, and a comparison is performed between the maximum value and an analog value of the electric potential V, which is input to a minus side of an input terminal. When the analog value of the electric potential V is larger than the maximum value, the comparator 820 sets the logic of the HFAIL signal as L level and informs that the electric potential V is "HIGH FAIL". On the other hand, when the analog value of the electric potential V is smaller than the maximum value, the comparator 820 outputs a signal of H level as an HFAIL signal and informs that the electric potential V is "HIGH PASS".

Similarly, a minimum value is input to a minus side of an input terminal of the comparator 830 from a D/A convertor 850, and the electric potential V is input to a plus side of an input terminal. The comparator 830 sets the logic of the LFAIL signal to be L level (LOW FAIL) or H level (LOW PASS) according to the comparison result.

In the configuration of FIG. 1, the determination of the digital value (A/D conversion) is performed at the A/D convertor 810, and the pass/fail judgement is performed at the comparator 820 and 830, independently. It cannot be avoided that a few differences arise among the characteristics of the A/D convertor 810 and the comparator 820 and 830 during the manufacturing process. Therefore, there is a problem that inconsistency of the result arises such that the judgement is a fail although the digital value is within the allowable range. To solve the above mentioned problems, an electric potential detector shown in FIG. 2 was used.

FIG. 2 is a circuit diagram that shows another configuration of the conventional electric potential detector. First, the analog electric potential V input from the input terminal 30 is converted to digital by the A/D convertor 810. The digital value of the electric potential V output from the A/D convertor 810 is then input to both of the digital comparator 920 and 930. Each of the maximum value and the minimum value are further input to the comparator 920 and 930, respectively, from the limit resistor 940 and 950, and the pass/fail judgement is performed as in the same way as in the configuration of FIG. 1.

As is clear from the above explanation, the pass/fail judgement is performed for the output of the A/D convertor 810 in the configuration of FIG. 2. Thus, the inconsistency of the result as in the case of FIG. 1 does not arise. However, the electric potential V has to be A/D converted even when it is sufficient to perform only the pass/fail judgement so that it takes a long time for a judgement.

SUMMARY OF THE INVENTION

Therefore, it is an object of the present invention to provide an electric potential detector, device tester, and a method of detecting electric potential that has a configuration of performing a judgement at high speed without causing an inconsistency of testing results in view of the above issues. This object is achieved by combinations of characteristics described in the independent claims. The dependent claims define further advantageous and exemplary combinations of the present invention.

To solve the above problems, the first aspect of the present embodiment is characterized in that the first embodiment comprises a comparator that compares an input electric potential, which is an object to be detected, with a referential value and outputs a comparison result; and a control circuit that has: a judgement means for performing a judgement of pass/fail of the input electric potential based on the comparison result obtained by providing an allowable limit value, which is a value indicating an allowable limit of an input electric potential, as the referential value; and a value determination means for finding a value of the input electric potential based on the comparison result obtained by providing the referential value to the comparator by varying the referential value.

The second aspect of the present invention is characterized in that the control circuit provides the comparator with a maximum value and a minimum value of an allowable range of the input electric potential, which is the allowable limit value, as the referential value and judges that the input electric potential is a failure when the input electric potential is judged as higher than the maximum value or judged as lower than the minimum value by the comparator.

The third aspect of the present invention is characterized in that the value determination means detects a transition point of the comparison result by selecting a value from a plurality of candidate values one after another arbitrarily as the referential value and determines a value of the input electric potential based on a candidate value that corresponds to the transition point.

The fourth aspect of the present invention is characterized in that the comparator includes a first and a second comparator to which the maximum value and the minimum value are input respectively; and the control circuit judges whether the input electric potential is allowable at a high potential side based on a comparison result of the first comparator and judges whether the input electric potential is allowable at a low potential side based on a comparison result of the second comparator.

The fifth aspect of the present invention characterized in that the input electric potential is analog; and the judging means provides the maximum value and the minimum value to the comparator at different timings; and the electric potential detector further comprises: a retaining means that retains the input electric potential while the maximum value and the minimum value are provided to the comparator.

The sixth aspect of the present invention is characterized in that the electric potential detector further comprises: an input electric potential retaining means for retaining the input electric potential during selection of a value from the plurality of candidate values one after another arbitrarily as the referential value.

The seventh aspect of the present invention is a device tester that comprises: a test pattern generator that generates an input test pattern, which is to be input to a device under test (DUT), and an expectation pattern, which is to be output from the DUT into which the input test pattern is input; a device testing comparator for judging a propriety of the DUT according to whether an output pattern, which is output from the DUT according to the input test pattern that is input to the DUT, and the expectation pattern matches; a power supply for supplying electric power to the DUT; and a terminal potential detecting circuit for detecting an electric potential of a terminal potential of the DUT; characterized in that: the terminal potential detecting circuit has: a sample potential comparator for outputting a comparison result by comparing a sample electric potential, which is input for observing the electric potential of the terminal, with a referential electric potential; a judging means for judging a pass/fail of the sample electric potential based on the comparison result obtained by providing an allowable limit potential, which is an electric potential that indicates an allowable limit of the sample electric potential, as the referential electric potential; and a control unit that includes a value determination means for finding a value of the sample electric potential based on the comparison result obtained by providing the referential electric potential to the sample potential comparator by varying the referential electric potential.

The eighth aspect of the present invention characterized in that the method comprises: a judging step for judging whether an input electric potential, which is an object to be tested, is within an allowable range and judging as "failure" when an input electric potential is not within an allowable range; and a retrieving step for retrieving a detailed value of the input electric potential corresponding to a judgement, which is given as the "failure" in the judging step.

The ninth aspect of the present invention is characterized in that the judging step judges whether the input electric potential is within the allowable range by comparing a maximum and minimum of the allowable range and the input electric potential.

The tenth aspect of the present invention is characterized in that the retrieving step is the step that detects a transition point of a comparison result by comparing a value, which is selected from a plurality of candidate values as a reference, with the input electric potential one after another and determines the detailed value according to a candidate value corresponding to the transition point.

This summary of the invention does not necessarily describe all necessary features so that the invention may also be a sub-combination of these described features.

DETAILED DESCRIPTION OF THE INVENTION

EMBODIMENT 1

In the following, the invention will now be described based on the preferred embodiments, which do not intend to limit the scope of the present invention, but exemplify the invention. All of the features and the combinations thereof described in the embodiment are not necessarily essential to the invention.

Figure 3:
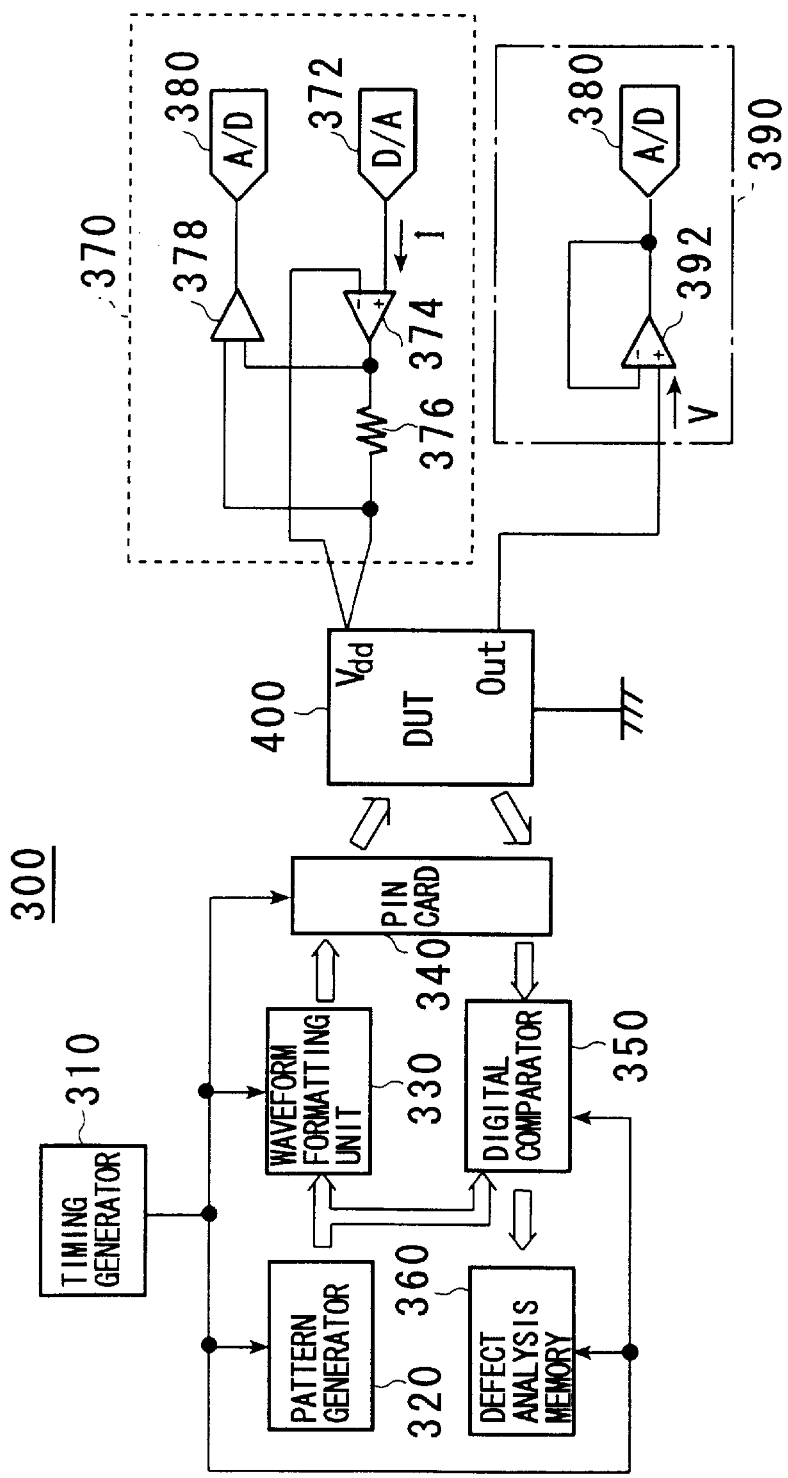
FIG. 3 is a circuit diagram that shows a configuration of an automatic toting apparatus 300.

FIG. 3 is a circuit diagram that shows a configuration of an automatic testing apparatus 300. The automatic testing apparatus 300 is an apparatus that automatically tests whether a device 400, which is an object to be detected, is good or bad. In the following, the configuration and the operation of the automatic testing apparatus 300 will be explained.

The timing generator 310 provides a timing signal to a pattern generator 310, a waveform formatting unit 330, a pin card 340, a digital comparator 350, and a defect analysis memory 360. The pattern generator 320 outputs to the waveform formatting unit 330 an address signal, which indicates an address of the device 400 that is to be detected, and an input test pattern signal, which is used for an arithmetic process in the device 400. The waveform formatting unit 330 formats the waveform of the address signal and the input test pattern signal according to the characteristic of the device 400.

The device 400 is electrically connected to the pin card 340, which is comprised in the automatic testing apparatus 300, and the device 400 receives the address signal and the input test pattern from the waveform formatting unit 330 through the pin card 340. The device 400 performs the logical operation according to these signals and provides an output pattern to the digital comparator 350 as an operation result through the pin card 340.

In addition to the output pattern, which is output from the device 400, an expectation value pattern is input to the digital comparator 350 from the pattern generator 350. The expectation value pattern is a pattern, which is expected to be output from the device 400 when the logic operation is normally performed in the device 400. The digital comparator 350 indicates whether the device 400 is good or bad by the level of the signal by comparing the output pattern and the expectation value pattern to judge whether the output pattern and the expectation value pattern matches. The defect analysis memory 360 stores the output of the digital comparator 350 for the defect analysis, which will be performed later.

The device 400 is exchanged one after another at the pin card 340 of the automatic testing apparatus 300 for testing. Therefore, to obtain a correct test result for each of the devices 400, an electric current provided from the power supply 370, which provides electric power to the device 400, has to be accurately measured. Thus, the electric potential detector 380 is comprised in the power supply 370 in order to measure the electric potential after the current-voltage conversion. Moreover, it is necessary to confirm whether an H level signal output from the output terminal "Out" of the device 400 is output according to the setting. For this purpose, a measuring unit 390 having the electric potential detector 380 is provided for detecting the signal of the output terminal "Out".

The power supply 370 comprises a D/A convertor 372 that supplies an electric current for providing a constant electric potential to the power supply terminal Vdd of the device 400. To stabilize the output of the D/A convertor 372, a comparator 374 is comprised inside the power supply 370. A resistor 376 is inserted between the output terminal of the comparator 374, the plus side of the input terminal of which is connected to an output terminal of the D/A convertor 372, and the power supply terminal Vdd of the device 400. The power supply terminal Vdd is connected to the minus side of the input terminal of the comparator 374 while applying a negative feedback.

In the power supply 370, an electric current value, which is output from the D/A convertor 372, is observed indirectly by observing the voltage applied to the resistor 376. The voltage applied to the resistor 376 is amplified by the differential amplifier 378, and the pass/fail judgement or the A/D conversion is performed at the electric potential detector 380.

On the other hand, in the measurement unit 390, a terminal potential of the output terminal "Out" is observed by the electric potential detector 390. A comparator 392 is inserted between the output terminal "Out" and the electric potential detector 380 to stabilize the terminal potential. The output terminal "Out" is connected to the plus side of the input terminal of the comparator 392, and the feedback is applied to the minus side of the input terminal. An electric potential output from the comparator 392 is input to the electric potential detector 380, and the pass/fail judgement or the A/D conversion is performed.

As described later, there is no inconsistency between the pass/fail judgement and the A/D conversion performed by the electric potential detector 380 of the present embodiment, and the judgement of the propriety of the terminal potential can be quickly finished when performing only the pass/fail judgement. By this, it is possible to promptly confirm that the terminal potential is normal, and it is possible to finish the testing of the device 400 effectively by the automatic testing apparatus 300.

Furthermore, in the above explanation, the observation of an electric potential is indirectly performed by converting an electric current to a voltage in the power supply 370, and the observation of an electric potential is directly performed without conversion in the measurement unit 390. However, the selection of converting or not converting can be performed arbitrarily. For example, the observation of the electric potential can be performed directly in both cases of power supply 370 and the measurement unit 390.

Next, the configuration and the operation of the electric potential detector 380 will be explained.

Figure 4:
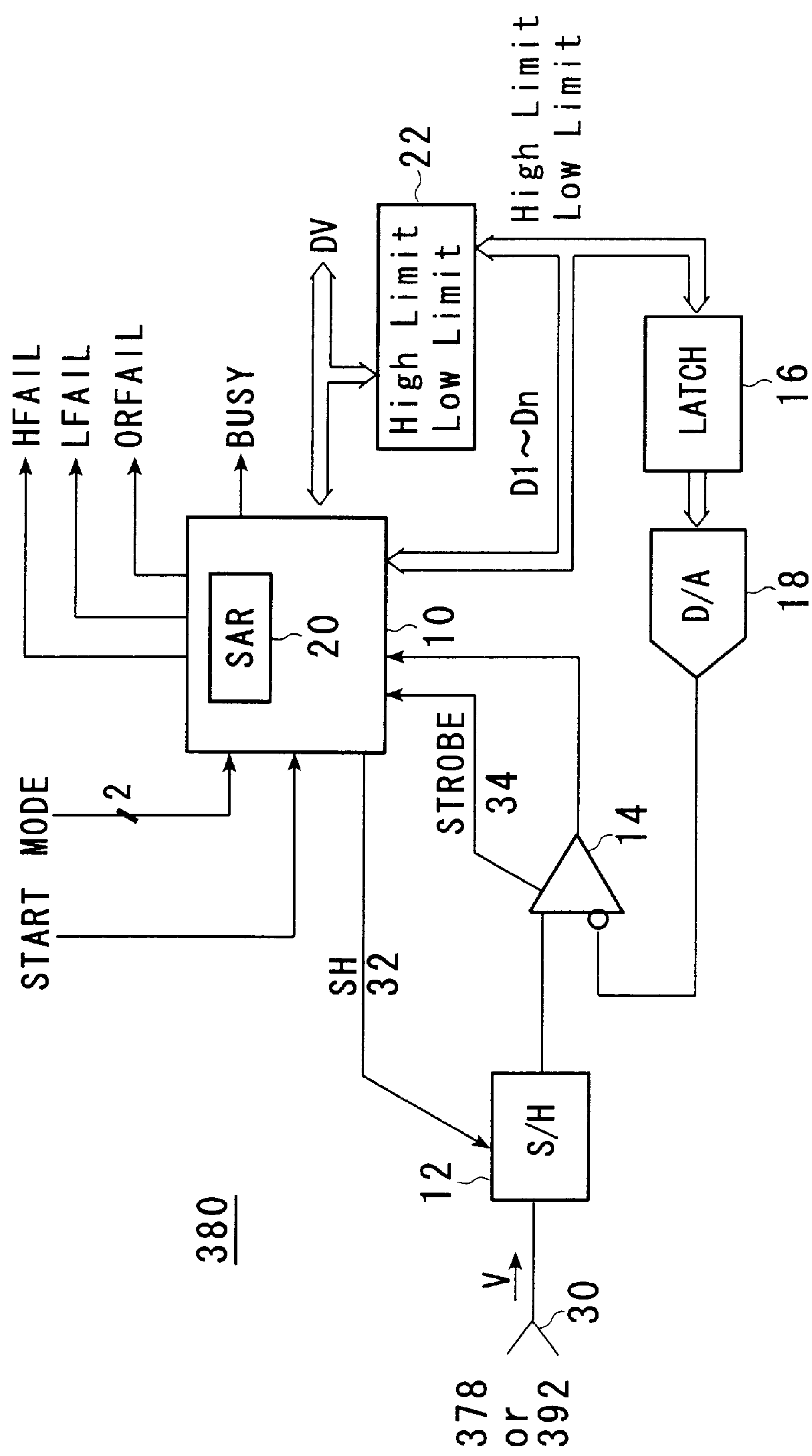
FIG. 4 is a circuit diagram that shows the configuration of the electric potential detector 380 of the embodiment 1.

FIG. 4 is a circuit diagram that shows the configuration of the electric potential detector 380 of the present embodiment. The electric potential detector 380 can perform not only the A/D conversion but also the pass/fail judgement by modifying the conventional A/D convertor. Concretely, it is possible for the electric potential detector 380 to select whether to perform the A/D conversion by varying the referential value of the comparison intermittently or to perform the pass/fail judgement by setting the referential value to a maximum value or a minimum value of the allowable range. This kind of selection is realized by a control circuit 10 comprised in the electric potential detector 390. In the following, the configuration and the operation of the electric potential detector 380 will be explained using FIG. 4 and FIG. 5.

Figure 5:
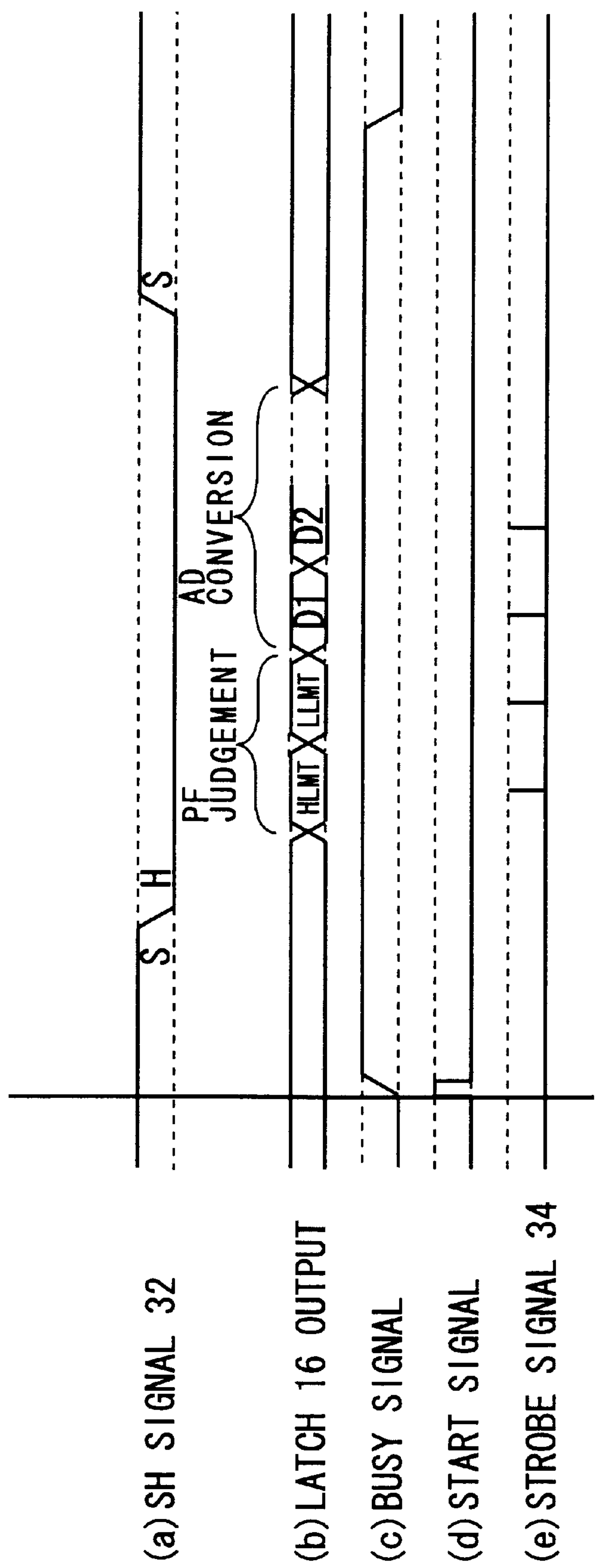
FIG. 5 is a timing chart that shows the condition of the signal of the electric potential detector 380 of the embodiment 1.

FIG. 5 is a timing chart of the electric potential detector 380 related to the example of performing an A/D conversion after the pass/fail judgement. Of course, it is not necessary to perform A/D conversion after performing the pass/fail judgement, and it is possible to merely confirm whether the electric potential V is normal by the pass/fail judgement. Moreover, it is possible to perform only the A/D conversion without performing the pass/fail judgement. Furthermore, it is possible to perform the pass/fail judgement after performing the A/D conversion.

First, the user instructs the control circuit 10 to start the process by raising a start signal START to H level (setting a logic to "1") as shown in FIG. 5(*d*). Responding to this, the control circuit 10 sets the logic of a signal BUSY to "1" and notifies the outside that the control circuit 10 is on processing.

The analog electric potential V, which is input from the input terminal 30, is provided to one of the input terminals of the comparator 14 through the sample hold circuit 12. The control circuit 10 controls the sample hold circuit 12 to switch the inputting and the retaining of the electric potential V, which is a sample. As shown in FIG. 5(*a*), the control circuit 10 changes the logic of the sample hold (SH) signal 32 from "1" to "0" and makes the sample hold circuit 12 to retain the analog value of the input electric potential V during the processing. By this, it is possible to avoid the changing of the testing object from occurring during the processing from the pass/fail judgement to the A/D conversion. Therefore, the reliability of the testing is secured.

Next, the control circuit 10 accesses a limit resistor 22 in order to input a maximum value of the allowable limit to another input terminal of the comparator 14. The limit resistor 22 is a configuration that is newly provided to the conventional A/D converter to enable the A/D convertor to perform the pass/fail judgement. The maximum value and the minimum value of the allowable limit is digitally stored in the limit resistor 22, and the control circuit 10 provides the digital maximum value, which is read out of the limit resistor 22, to the D/A convertor 18 through the latch circuit 16. The latch 16 retains the maximum value while the D/A convertor 18 performs the conversion as shown in FIG. 5(*b*).

The maximum analog value output from the D/A convertor 18 is input to another input terminal of the comparator 14. The comparator 14 compares the analog value of the electric potential V with the value, which is obtained by inverting the maximum analog value, as a reference. In this way, the comparator 14 has a role to compare the analog value of the electric potential V with the analog value of the data provided from the control circuit 10 as a reference. In the following, the value provided as a reference such as the maximum value is called a "referential value".

The comparison result is input to the control circuit 10 according to the excitation of the strobe signal 34, which is provided to the comparator 14, to "1" by the control circuit 10 as shown in FIG. 5(*e*). In the case of showing the comparison result of which the electric potential V is larger than the maximum value, which is a referential value, the control circuit 10 changes the logic of the HFAIL signal from "1" to "0" and informs the outside that the electric potential V exists above the allowable range. After finishing the process of the maximum value, the same process is performed for the minimum value (refer to FIG. 5(*b*) and FIG. 5(*e*)). When the comparison result is obtained such that the electric potential V is smaller than the minimum value, which is a referential value, the control circuit 10 changes the logic of the LFAIL signal from "1" to "0" and informs the outside that the electric potential V exists below the allowable range. Moreover, the control circuit 10 operates a logical multiplication of the HFAIL signal and the LFAIL signal and generates a signal ORFAIL that informs that there is an abnormality in the electric potential V (or, the electric potential fails).

Figure 2:
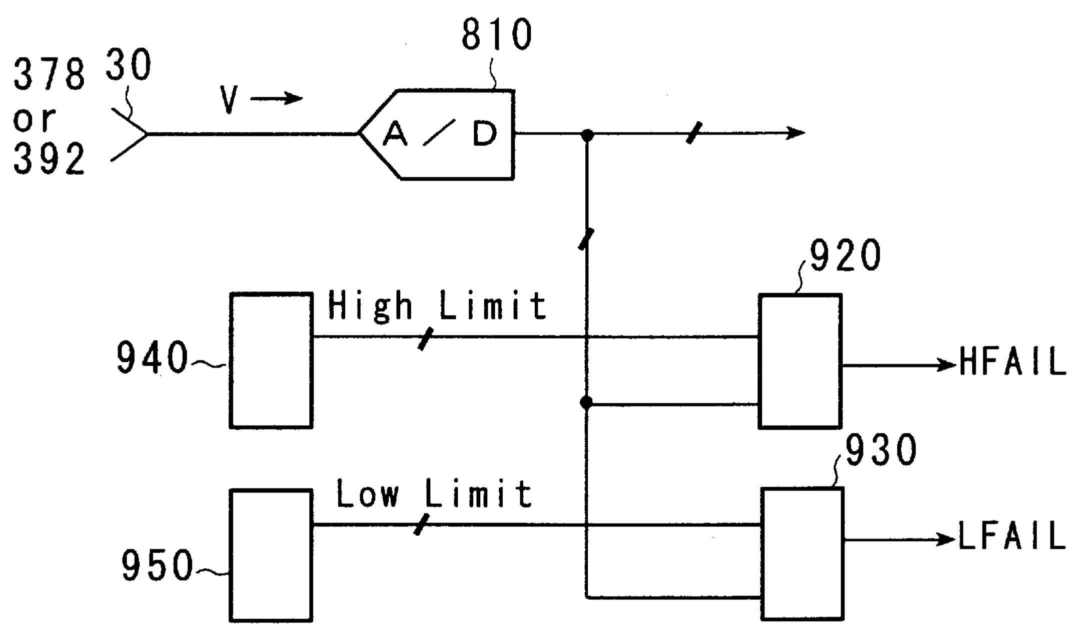
FIG. 2 is a circuit diagram that shows a configuration of the conventional electric potential detector.

As is clear from the above description, in the configuration of the present embodiment, the time required for pass/fail judgement is controlled by the time required for a D/A conversion in the D/A convertor 18. On the other hand, in the conventional configuration of FIG. 2, the time taken for the pass/fail judgement is controlled by the time taken for the A/D conversion in the A/D convertor 810. It is a well known fact that the D/A conversion is finished faster than the A/D conversion so that the configuration of the present embodiment is faster than the conventional configuration.

When the pass/fail judgement is finished, as shown above, the control circuit 10 continuously performs the A/D conversion the same as the processing of the conventional A/D convertor.

Figure 6:
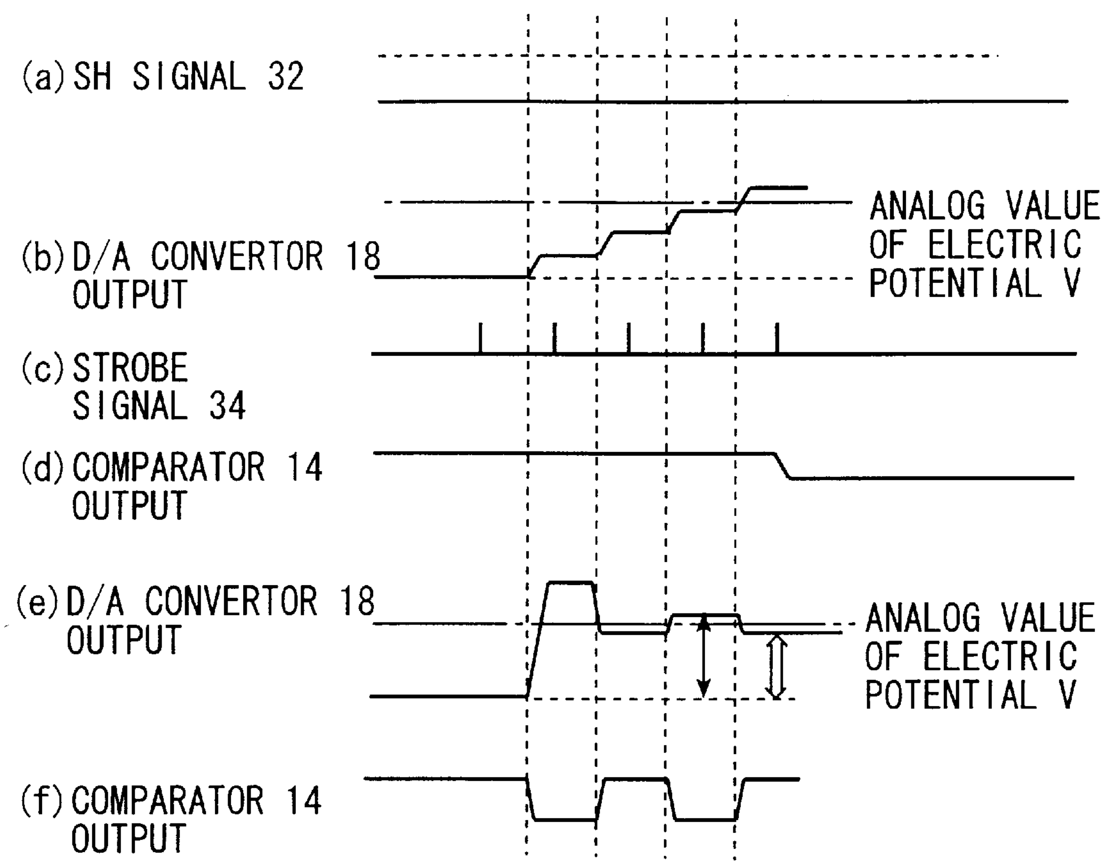
FIG. 6 is a timing chart that shows a condition of the signal at the A/D conversion.

FIG. 6 is a detailed timing chart that shows a level of a signal during the performing of the A/D conversion. Details of the timing chart will be described using FIG. 6. To perform the pass/fail judgement and the A/D conversion for the same object, the control circuit 10 maintains the sample hold signal 32 as "0" as shown in FIG. 6(*a*). Responding to this, the sample hold circuit 12 of FIG. 4 keeps retaining the analog value of the electric potential V without changes. Next, the control circuit 10 utilizes a successive approximation resistor (SAR) 20, which is conventionally used for an A/D conversion, to raise the output of the D/A convertor 18 stepwise as shown in FIG. 6(*b*). This kind of stepwise raising of the output can be realized by reading out the digital value, which is stored in the resistor 20, in the order from the smallest value. Moreover, the stepwise raising of the output can also be realized by performing the raising of the output plurality of times until the final value of the raising using the initial value of the raising, which is read out of the resistor 20, and the amount of increase per one time of raising. The digital data D1 to Dn (n is a natural number) obtained, as shown above, are provided to latch 16 one after another as shown in FIG. 5(*b*).

By the above configuration, the reference value of the comparator 14 is raised according to the stepwise increase of the output of the D/A convertor 18 as shown in FIG. 6(*b*). The control circuit 10 raises the strobe signal 34 to "1" when the output of the D/A convertor 18 becomes flat, that is when the referential value of the comparator 14 becomes stable, and the control circuit 10 inputs the output of the comparator 14, which is shown in FIG. 6(*d*), one after another. Here, it is worth noting that the comparator 14 used for pass/fail judgement is also used continuously for A/D conversion. By this, the difference of the characteristic caused by the difference of the comparison object cannot occur, and thus the inconsistency caused between each of the results of the pass/fail judgement and the A/D conversion can be avoided. Moreover, using the comparator 14 for both of the pass/fail judgement and the A/D conversion is effective in a point of reducing a circuit area.

Because the analog value of the electric potential V is larger than the output of the D/A convertor 18 in the early stage of the A/D conversion, the output of the comparator 14 becomes "1" as shown in FIG. 6(*d*). However, when the output of the D/A convertor 18 becomes larger than the analog value of the electric potential V, the output of the comparator 14 changes to "0" so that the relationship of the magnitude inverts. In this way, by grasping the transition of the relationship of the magnitude, the control circuit 10 can recognize that the analog value of the electric potential V exists between the values of the output of the D/A convertor 18 before and after the transition.

Responding to this, the control circuit 10 considers the arbitrary value between the two digital values, which is read out of the resistor 20 shown in FIG. 4 before and after the transition, as a value of the electric potential V and outputs to the outside as data DV. The determination of value can be performed by calculating the average of the digital value before and after the transition or by adopting one of the two digital values as it is.

In the above explanation, the example of gradually increasing the output of the D/A convertor 18 is used for an explanation, however, a binary search can also be used. FIG. 6(*e*) and FIG. 6(*f*) show a timing chart in a case of using a binary search. The control circuit 10 provides to the D/A convertor 18 the value that divides the range, where the value of the electric potential V exists, in two as data Di (where i is an arbitrary integral number from 1 to n). Furthermore, the control circuit 10 judges that which is the region of the divided range where the value of the electric potential V exists based on the comparison result between the analog output of the D/A convertor 18, which is accorded to the digital data Di, and the electric potential V. The control circuit 10 also performs the same process for the next data D(i+1).

In this way, the range, where the value of the electric potential V exists, is narrowed by observing the output of the comparator 14 with varying the output of the D/A convertor 18. Then, two digital values are finally found between which the value of the electric potential V exists, and the two digital values cannot be examined further. That is, it is found that the transition occurs on the magnitude relationship between the electric potential V and the referential value in this section. The control circuit 10 regards the arbitrary value between these digital values as a digital value of the electric potential V and outputs this to the outside as data DV.

As is clear from the above explanation, the configuration of the present embodiment avoids the occurrence of the inconsistency between the results of the pass/fail judgement and the A/D conversion by using the comparator 14 for both the pass/fail judgement and the A/D conversion. Moreover, in the case of only performing the pass/fail judgement, the present embodiment can perform the judgement at high speed.

Furthermore, in the configuration of FIG. 4, a limit resistor 22 is separately provided with the successive approximation resistor 20 that is used for A/D conversion. However, if the resistor 20 has an enough capacity, the maximum value and the minimum value may be stored in the resistor 20.

Figure 1:
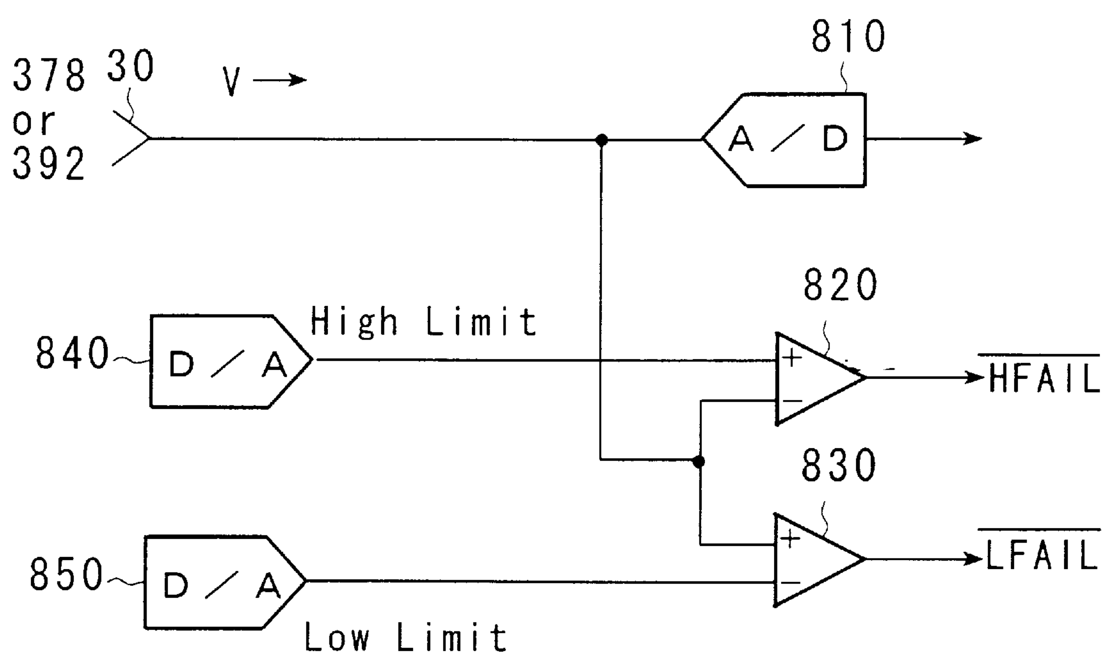
FIG. 1 is a circuit diagram that shows a configuration of the conventional electric potential detector.

Next, the conventional configuration will be explained in order to explain the embodiment of the combination of the process required for the configuration of the present embodiment. In the conventional configuration of FIG. 1, the A/D conversion and the pass/fail judgement is performed in parallel. Therefore, the scheme, which finds the detailed value of the electric potential V by performing the A/D conversion only when it is judged that an abnormality has occurred in the pass/fail judgement, is not necessary. Moreover, in the configuration of FIG. 2, the pass/fail judgement is performed based on the result of the A/D conversion, and therefore this kind of scheme is not necessary.

On the other hand, in the configuration of the present embodiment of FIG. 4, the pass/fail judgement and the A/D conversion is not performed in parallel but performed in order with a shifting of time. Therefore, there may arise a reason for adopting a scheme of performing the A/D conversion only when the abnormality is found by the pass/fail judgement. Thus, in the following, the configuration of performing the process according to the combinations selected by the user will be explained.

The combination of the pass/fail judgement and the A/D conversion is accepted as a mode by the control circuit 10 of FIG. 4. Table. 1 is a table that shows the types of the modes.

TABLE 1

| Mode | PASS/FAIL JUDGEMENT | A/D CONVERSION |
|---|---|---|
| 0 | perform | not perform |
| 1 | perform | perform if FAIL |
| 2 | perform | perform |
| 3 | not perform | perform |

As shown in Table. 1, there are four kinds of modes from mode 0 to mode 3. The mode 0 is a mode that performs only the pass/fail judgement and does not perform the A/D conversion of the electric potential V. The mode 1 performs the pass/fail judgement and performs the A/D conversion only when the result of the fail is obtained. The mode 2 performs both the pass/fail judgement and the A/D conversion. The mode 3 performs only the A/D conversion and does not perform the pass/fail judgement. The user can perform the desired testing of the electric potential V by informing the desired mode to the control circuit 10 by the mode signal of FIG. 4. In the following, the process performed by the electric potential detector 380 will be explained sequentially using FIG. 4 and FIG. 7.

Figure 7:
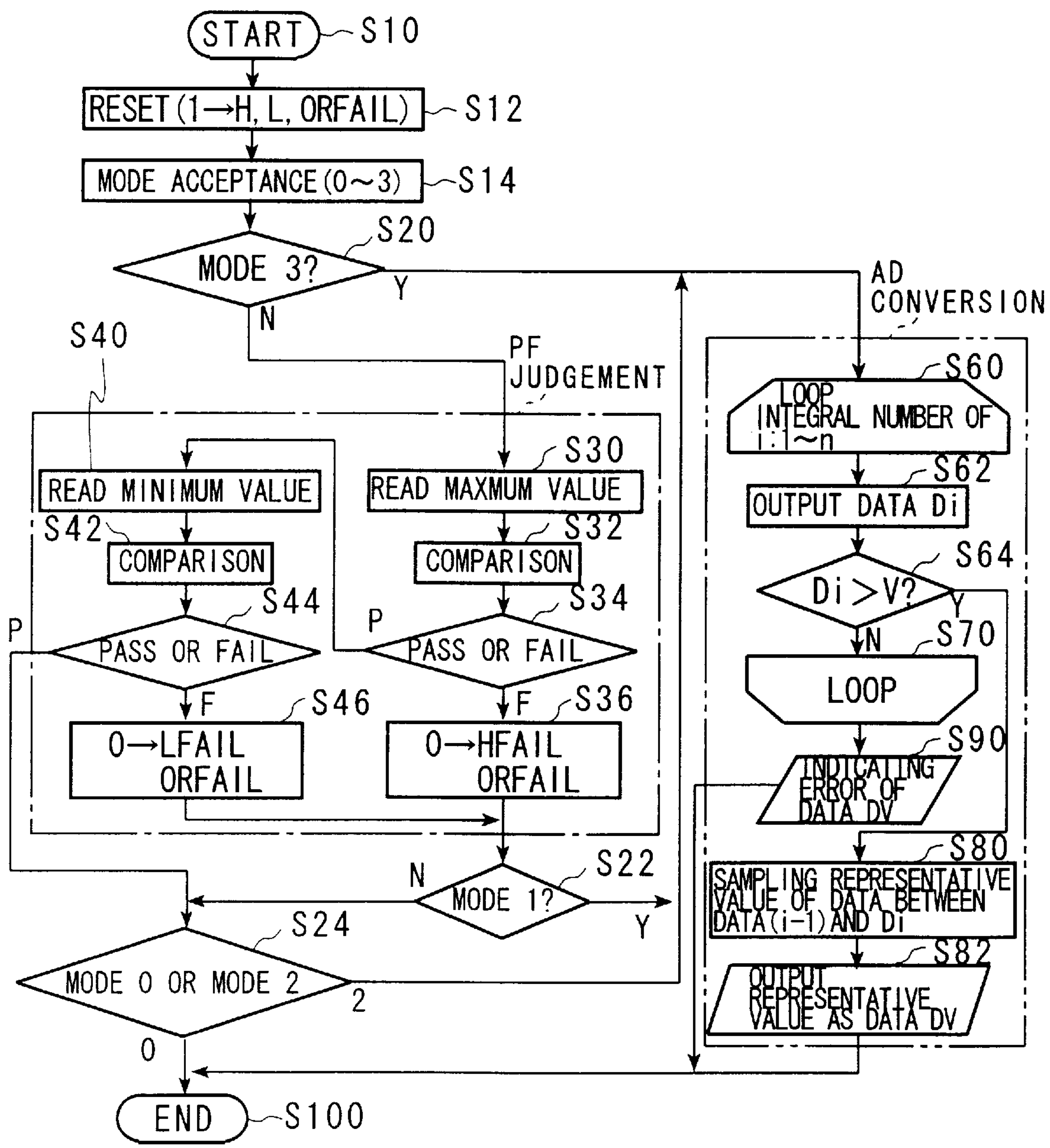
FIG. 7 is a flow chart that shows a first example of the process procedure of the electric potential detector 380 of the embodiment 1.

FIG. 7 is a flow chart that shows a process performed by the electric potential detector 390. First, the process is started by responding to the start signal "START" of FIG. 4 becoming H level as shown in FIG. 5(*d*) (Step S10 of FIG. 7). Responding to this, the control circuit 10 sets the electric potential of the HFAIL signal, the LFAIL signal, and the ORFAIL signal to "1" (H level) at step S12 to perform the reset.

Next, in step S14, the control circuit 10 accepts the mode of testing by the mode signal. In the following step S20, the control circuit 10 judges whether the input mode is mode 3 or not, that is, judging whether the pass/fail judgement is required or not (Refer to Table. 1). If the judgement is "YES", the process that follows from step S30 is performed, and if the judgement is "NO", the process follows from step S60 is performed.

In FIG. 7, the processes from steps S30 to S46, which are surrounded by the projected line, are the processes for the pass/fail judgement. First, in step S30, a maximum value is read out of the limit resistor 22 of FIG. 4. In the following step S32, the comparison is performed by the comparator 14 of FIG. 4, and it is judged whether the comparison result is a pass (P: Normal) or a fail (F: Abnormal). If the result is judged as "P", reading of the minimum value, comparison, and the pass/fail judgement are performed similarly in steps S40–S44.

On the other hand, if the result is judged as "F" in step S34, the values of the HFAIL signal and the ORFAIL signal are rewritten to "0" in step S36. If the result is judged as "F" similarly in step S44, the value of the LFAIL signal is rewritten to "0" instead of the HFAIL signal in step S46. If the result is judged as "P" in step S44, there is no abnormality in the value of the electric potential V, and the process shifts to step S24. In step S22, which follows after steps S36 and S46, whether the mode is mode 1 or not is judged. If the result is judged as "NO", the process shifts to step S24 because it is not designated to perform the A/D conversion according to the result of the fail (refer to Table. 1). If the result is judged as "YES", the process shifts to step S60 to perform the A/D conversion according to the result of the fail.

In step S24, it is judged that the mode is either one of the mode 0 or the mode 2 to judge whether the A/D conversion should be performed after the pass/fail judgment (refer to Table. 1). If the mode is judged as mode 0, there is no need to perform the A/D conversion so that the process is finished at step S100. If the mode is judged as mode 2, the process shifts to step S60 to perform the A/D conversion.

The processes of steps S60–S90 surrounded by the phantom line are the processes related to the A/D conversion. In particular, the processes between steps S60 to S70 are the loop process for the A/D conversion. In FIG. 7, an example is taken for the case in which the output of the D/A convertor 18 is increased stepwise as shown in FIG. 6(*b*) for the process between steps S60 and S70.

As shown in step S60, the loop process is performed for the number "i", which is an arbitrary integral number of 1 to n. First, in the step S62, the analog value of the data Di, which is to be a reference value, is output to the comparator 14 of FIG. 4 as already described in FIG. 5(*b*). Then, whether the analog value of the data Di is larger than the analog value of the electric potential V is judged in step S64. The case when the judgement is "YES" is the case when the transition has occurred in the magnitude relationship between the data D(i−1) and Di and is the case when the value of the electric potential V exists in this section. Therefore, the process leaves from the loop process and shifts to step S80 to determine the value of the electric potential V. If the judgement is "NO", the loop process from S60 to S70 is performed continuously.

In step S80, the arbitrary value between the data D(i−1) and Di is abstracted as a representative value of this section. In the following step S82, this representative value is regarded as a value of the electric potential V and is output as data DV. Then, the process is finished at step S100.

On the other hand, if the value of the electric potential V does not exist between the data D1–Dn, which is the case when the value of the electric potential V is out of the retrieval range that is previously set in the resistor 20, it means that the judgement of "YES" is never given in step S64. In this case, the loop process between the steps S60 and S70 is finished, and the error of the data DV is indicated in step S90. By this, the user can know that the value of the electric potential V exists outside the retrieval range. Then, the process is finished at step S100.

In the flowchart of FIG. 7, step S22 and step S24 are separated, and the judgement whether the mode is a mode 1 or not and the judgement whether the mode is either one of the mode 0 or mode 2 are separately performed. However, these judgements can be performed together.

Here, the judgement of whether the mode is mode 1 or not in step S22 of FIG. 7 is performed in order to perform the A/D conversion only when the judgement of "FAIL" is given at step S34 or step S44. Whether the judgement is "FAIL" or not can be known by confirming whether the value of the ORFAIL is rewritten to "0" in step S36 or step S46. Thus, it is possible to adopt the configuration of using the value of ORFAIL as a flag.

Figure 8:
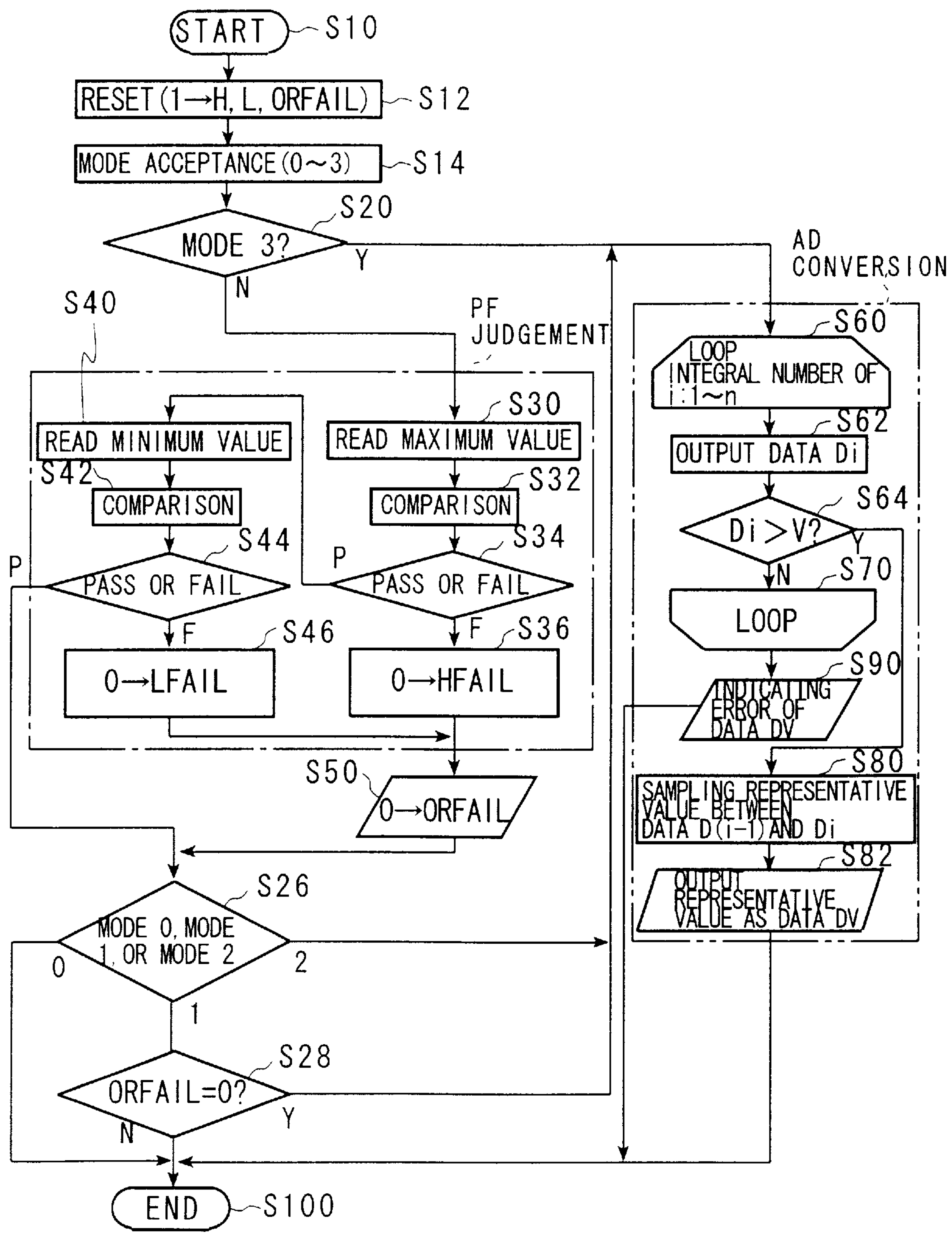
FIG. 8 is a flow chart that shows a second example of the process procedure of the electric potential detector 380 of the embodiment 1.

FIG. 8 is a flow chart that shows a process procedure, in which a part of the process procedure of FIG. 7 is transformed. To make the procedure be easily understood, the rewriting of the ORFAIL, which is performed at step S36 or step S46 in FIG. 7, is performed at step S50, which follows after step S36 and step S46, in FIG. 8. Then, the judgement of whether the mode is either one of the modes 0 to mode 2 is performed at step S26 of FIG. 8. If the mode is judged as mode 1, whether the ORFAIL is "0" or not is judged at the following step S28. If the judgement is "YES", the process shifts to step S60 that performs the A/D conversion. Even by the above process procedure, the operation of the electric potential detector 380 of FIG. 4 can be the same as that of FIG. 7.

Next, the process procedure in the case of finding the digital value of the electric potential V using the binary search will be explained.

Figure 9:
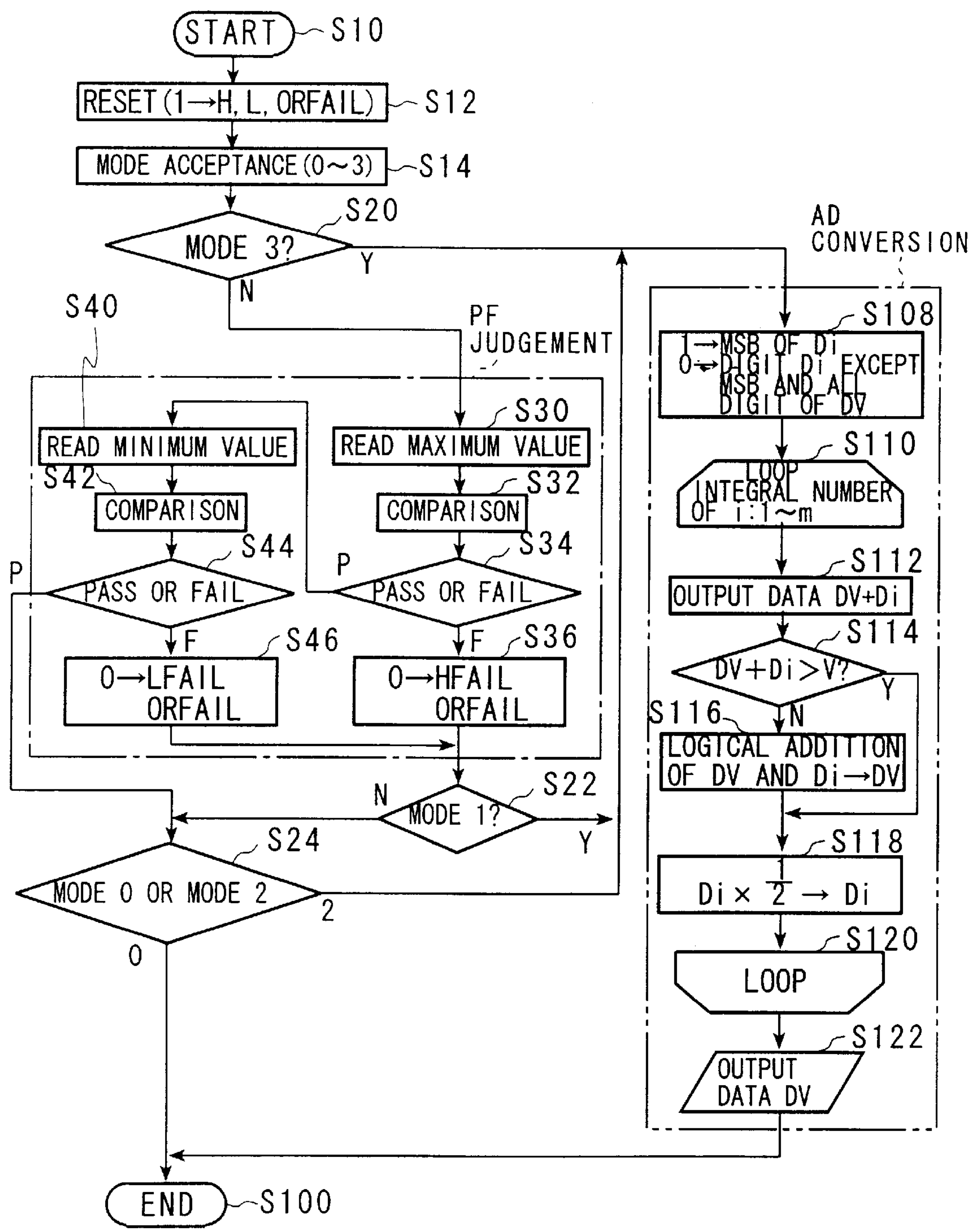
FIG. 9 is a flow chart that shows a third example of the process procedure of the electric potential detector 380 of the embodiment 1.

FIG. 9 is a flow chart that shows a process procedure in a case of using a binary search. The process procedure of FIG. 9 is the same as that of FIG. 7 except that the portion surrounded by the phantom line in FIG. 7 is transformed to use the binary search. The example of FIG. 9 shows the case in which the digital value to be found is m digits.

First, the initial setting is performed at step S108. As an initial setting, only the logic of the MSB (most significant bit) of the data Di is set to "1", and all the logic of the other digits are set to "0". Here, the data Di is corresponded to the variable value, the value of which is reduced to half for each of the times of the retrieval in the binary search. Furthermore, in step S108, the logic of all the digits of the data DV is set to "0" in order to reset the value of data DV. Here, the data DV is corresponded to the original value, to which the data Di that is a variable value is added.

In step 110, the number "i", in which the loop process is performed, is defined as the integral number from "1 to m" by corresponding to find the m digits digital value. The value of the sum of the data DV and the data Di is output at the following step 112.

In the next step S114, whether the electric potential V is smaller than the summed value of "Dv+Di", which is a referential value, is judged. If the judgement is "NO", the electric potential V is below the referential value, and the logical sum is calculated for each digit between the data DV and the data Di in step S116 to generate the new data DV. If the judgement is "YES", the process shifts to step S118 in order not to rewrite the value of the data DV in view that the summed value is larger than the electric potential V. In step S118, "Di×(1/2)" is set as the new data Di to make the next variable value of the binary search to be half.

Figure 10:
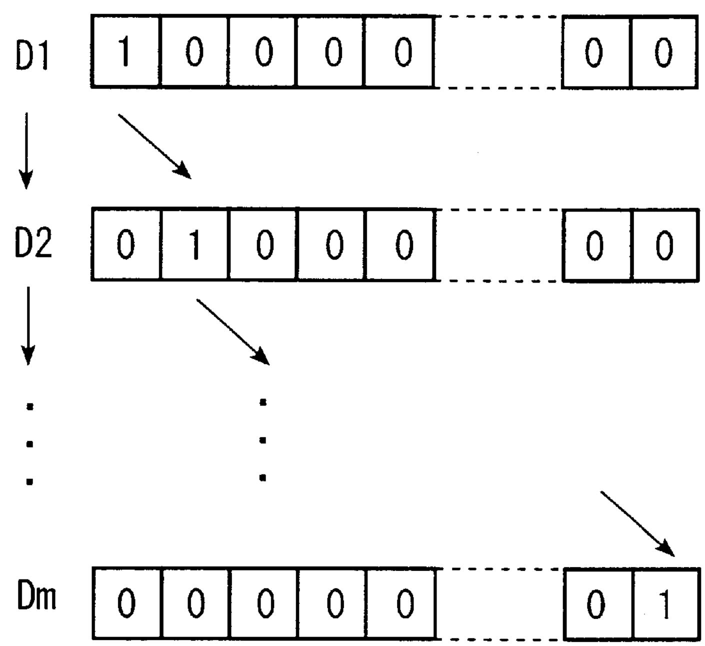
FIG. 10 is a modeled figure that shows the logic of the digits of the data D1.

FIG. 10 is a modeled figure that shows the logic of the digits of the data D1–Dm. The data D1–Dm are binary numbers. To make the value of the data Di to be half is corresponded to shift the logic of the digits of the data Di for 1 bit in a right direction.

In the next step S120, the command that instructs to continue the loop process for the number "i" is output. Then, if the loop process is finished, the data DV is output at step S122.

Next, the configuration for effectively performing the A/D conversion will be explained. In the process procedure of the embodiment 1 shown in FIG. 7, the configuration of performing the A/D conversion with corresponding to obtain the result of fail at the pass/fail judgement is adopted (step S22). However, it is already known that the value of the electric potential V is (1) above the maximum value (step S30 and S32), (2) below the minimum value (step S40 and S42), or (3) existed between the maximum value and minimum value by the comparison of the electric potential V with the maximum value and the minimum value, the digital value of the electric potential V is always retrieved for a constant retrieval range in the loop process between step S60 to step S70 (refer to the definition of the number i at the step S60). In this way, the result of the pass/fail judgement is not fully utilized. Therefore, in the present embodiment, the configuration of only performing the A/D conversion for the existing range of the electric potential V, which is already known at the pass/fail judgement, will be explained.

Here, to change the retrieval range of the loop process between step S60 to step S70 according to the result of the pass/fail judgement, the definition of the range of the number "i" of the data, for which the process is repeatedly performed, may be performed according to the result of the pass/fail judgement. The effective conversion becomes possible by dividing the retrieval range in this way.

Figure 11:
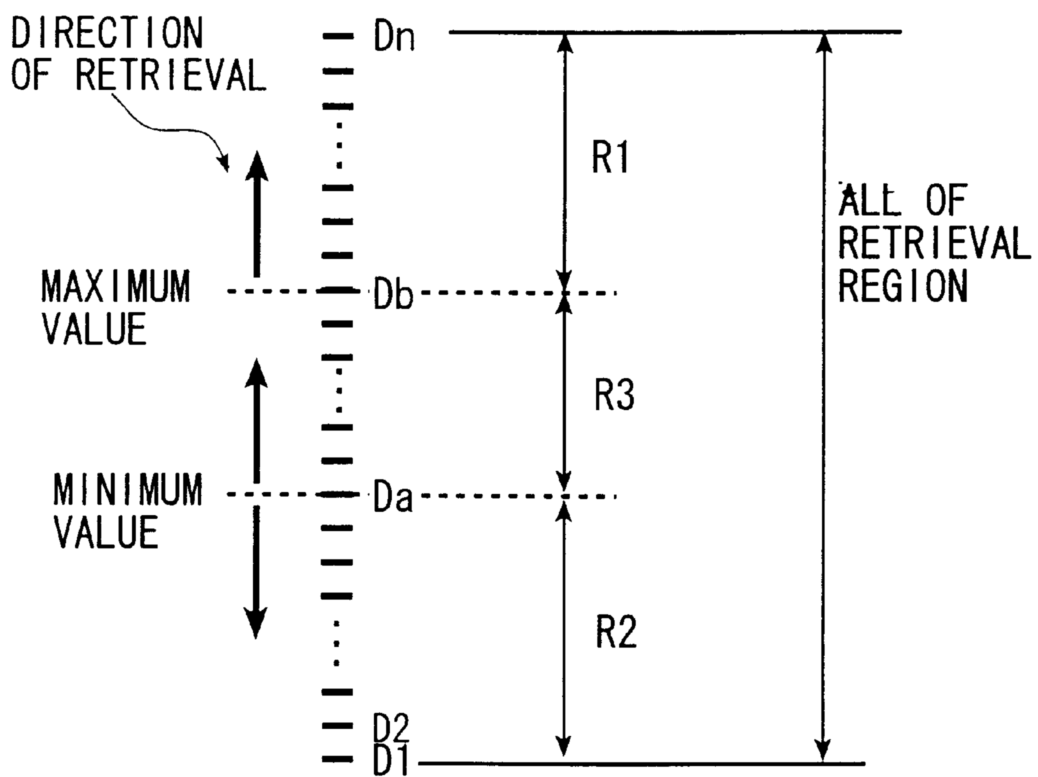
FIG. 11 is a modeled figure that shows the condition of the division of the retrieval range.

FIG. 11 is a modeled figure that shows the process of the division. As shown in FIG. 11, all of the retrieval range including the data D1–Dn is divided into the range R1, which is the range above the maximum value that includes the data Db–Dn, the range R2, which is the range below the minimum value that includes the data Da–D1, and the range R3, which is the range between the maximum value and the minimum value that includes the data Da–Db. Here, each of the data Db and Da is the data to be a maximum value and the minimum value, respectively. In the following, the process procedure that performs the A/D conversion for only the range of one of the divided ranges R1–R3, which is judged that the electric potential V exists by the pass/fail judgement, will be explained.

Figure 12:
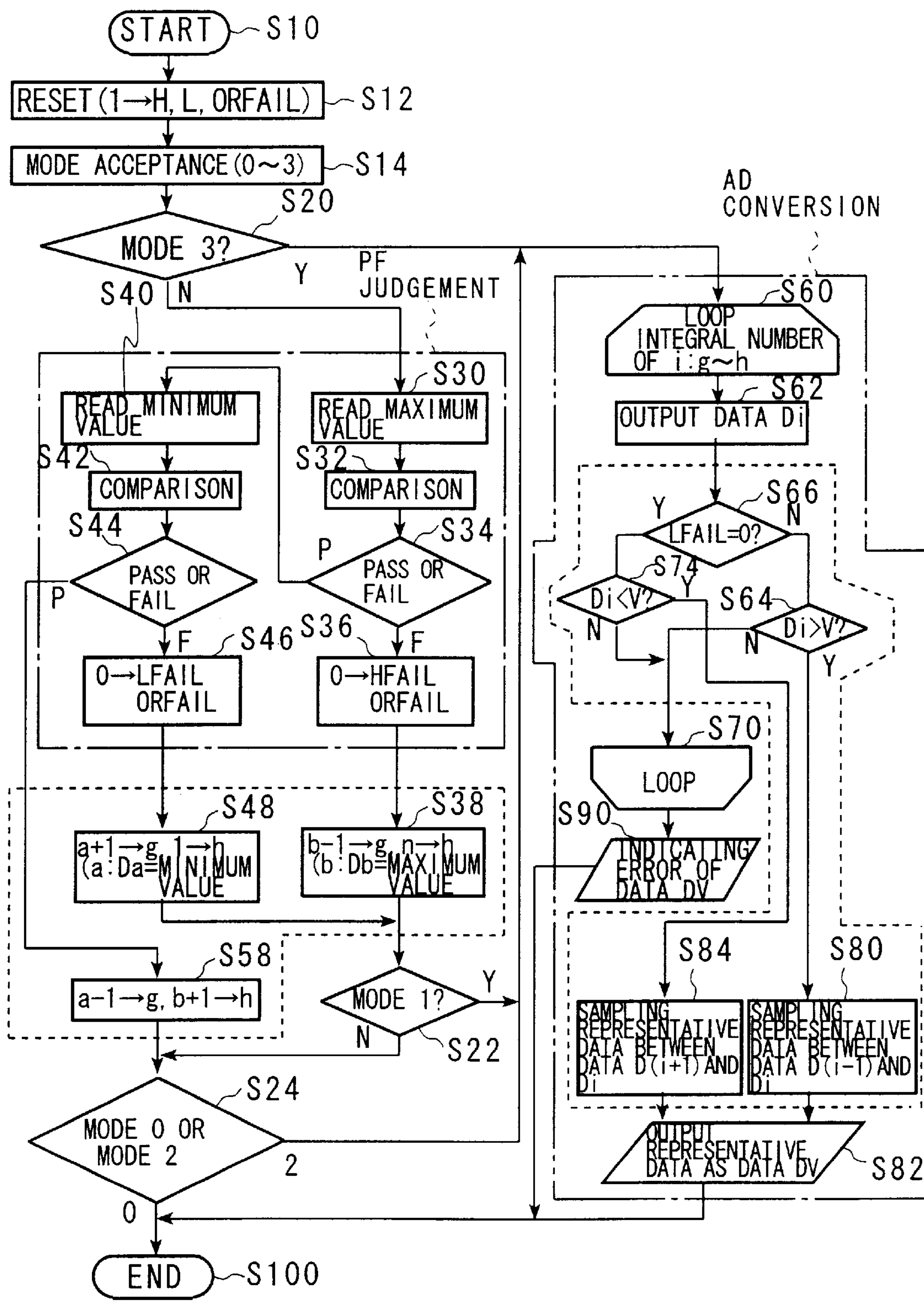
FIG. 12 is a flow chart that shows a third example of the process procedure of the electric potential detector 380 of the embodiment 1.

FIG. 12 is a flow chart that shows the process procedure of the present embodiment. The process procedure of FIG. 12 is made by modifying the process procedure of FIG. 7 to match the retrieval range of the loop process, which is performed between steps S60–S70, and the existence range of the electric potential V, which is found by the pass/fail judgement. Concretely, each of the steps S38 and S48 are inserted between step S36 or step S46 and step S22, respectively. Furthermore, step S58 is inserted between step S44 and step S24. Moreover, to enable to perform the retrieval effectively within the existence range, the process between step S62 and step S70 or S82 in FIG. 7 is modified. The above portion is surrounded by the hidden line to make the modified portion easily recognizable. For the other portions, there is no difference between each of the process procedure of FIG. 7 and that of FIG. 12. In the following, the process procedure of the present embodiment will be explained on the basis of the difference between the present embodiment and the embodiment 1.

The number "i", in which the loop process is performed, is defined as an integral number that is included between the range of the two constants g and h as shown in step S60. Corresponding to this, the definition for dividing the retrieving range is performed for the constant g and h in the steps S38, S48, and S58. The definition is performed as explained below.

When the judgement is "FAIL" in step S34, that is, when the value of the electric potential V is judged as larger than the maximum value, each of the constants g and h are limited to the integral numbers of b−1 and n, respectively, in step S38. By this, the retrieval range of the loop process between step S60 and step S70 is limited to the range R1.

Actually, the retrieval range is limited to the region where the region sticks out for one scale to the range R3 by setting the constant g to "b−1" and not "b". This setting is made for considering the case in which the electric potential V is just the same as the maximum value Db.

Similarly, each of the constants g and h are limited to the integral numbers of a+1 and 1, respectively, to limit the retrieval range only to range R2 in step S48. The reason for arranging the number "i" from the largest number as "a+1 to 1" by the above definition is to perform the retrieval effectively. However the electric potential V is abnormal, there is a large possibility that the value of the electric potential V exists close to the minimum value. Therefore, by arranging the number "i" from the largest value as "a+1 to 1", the retrieval is performed from the number near to the minimum value to the number far from the minimum value as shown in the thick arrow of FIG. 11. In step S58, the retrieval is performed only for the range R3 by limiting each of the constants g and h to the integral number a−1 and b+1, respectively.

Based on the definition of the constant g and h as explained above, the loop process of steps S60–S70 is performed in the appropriate retrieval range to find the analog value of the electric potential V. Here, as shown in FIG. 11, the direction of retrieval 10 is different between the range R1 and R3 and the range R2. In detail, the direction of the retrieval of the range R1 and R3 may be the same as the direction of the retrieval as shown in FIG. 7, however, the direction of the retrieval of the range R2 should be opposite to that of FIG. 7.

If the retrieval is performed in a downward direction, the referential value decreases stepwise. Therefore, it is necessary to judge whether the data Di is smaller than the electric potential V to discover the transition point of the magnitude relationship between the electric potential V and the referential value.

In view of the above difference, whether the LFAIL is "0" or not, that is, whether the retrieval range is the range R2 or the range R1 and R3 is judged in step S66. If the judgement is "NO", the retrieval range is R1 or R3, and whether the data Di is "larger" than the electric potential V or not is judged at step S64. On the other hand, if the judgement is "YES", the retrieval range is the range R2, and whether the data Di is "smaller" than the electric potential V is judged at step S74.

If the judgement is "YES" at the steps S64 and S74, the transition point of the magnitude relationship is discovered, and the process shifts to the process of the steps S80 and S84. In the step S84, the representative value is sampled from the data between the data D(i+1) and Di according to the direction of the retrieval that is performed downwards. If the judgement is "NO" in steps S64 and S74, the loop process is performed continuously.

By the configuration of the present embodiment as shown above, it is possible to fully utilize the result of the pass/fail judgement and to reduce the time required for the A/D conversion. Moreover, this configuration is also effective for the case in which the pass/fail judgement is actually not needed, and only the result of the A/D conversion is needed. By performing the pass/fail judgement before the A/D conversion to narrow the retrieval range on purpose, it is expected that the value of the electric potential V can be obtained faster than the case where only the A/D conversion is performed alone.

EMBODIMENT 2

In the electric potential detector 380 of the embodiment 1 of FIG. 4, the one comparator 14 performs the comparison for both the maximum value and the minimum value. Therefore, it is impossible to perform the comparison for the maximum value and the minimum value at the same time so that it takes a long time for detection. Thus, in the present embodiment, the configuration that performs the comparison for both the maximum value and the minimum value at the same time will be explained.

Figure 13:
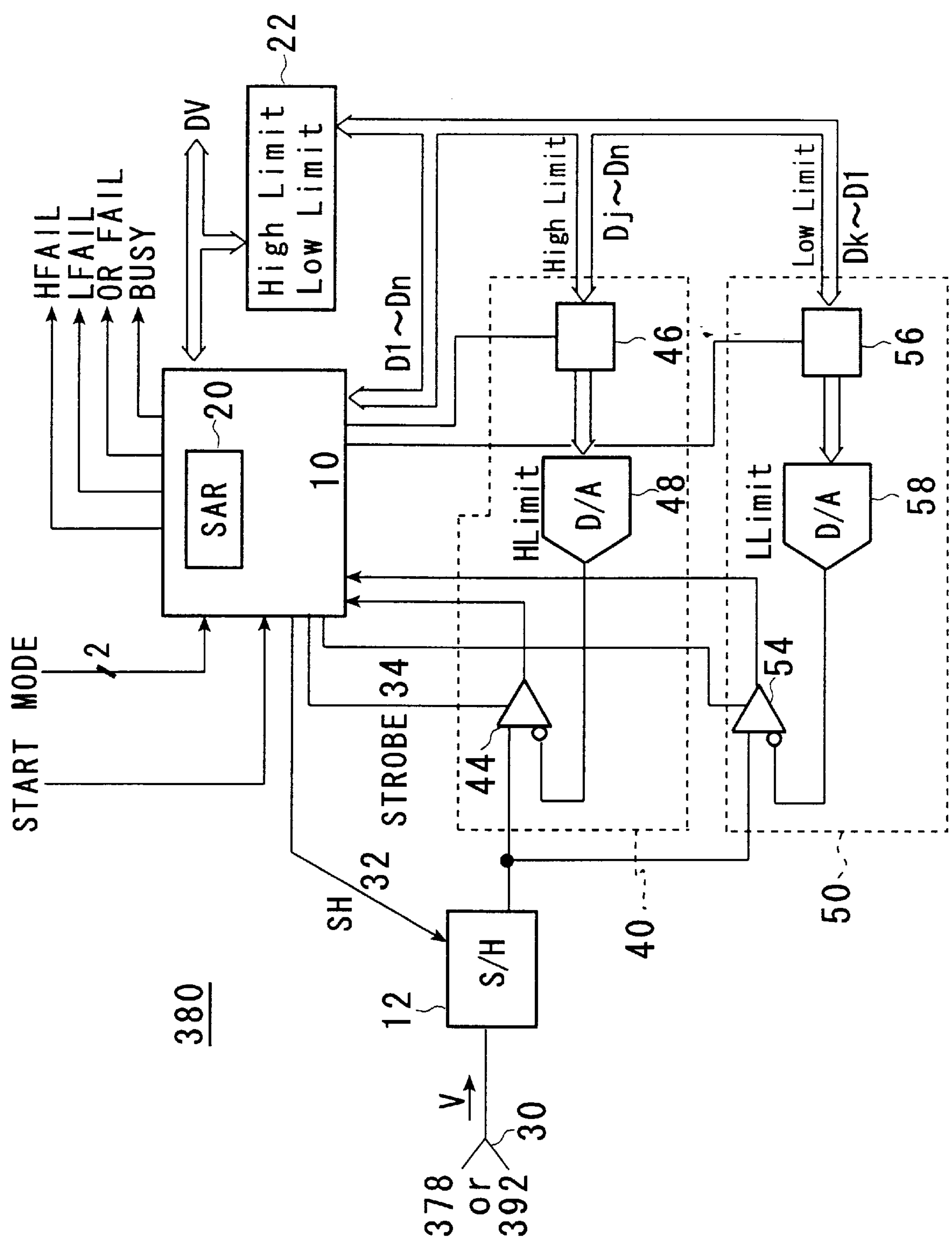
FIG. 13 is a circuit diagram that shows the example of the configuration of the electric potential detector 380 of the embodiment 2.
Figure 14:
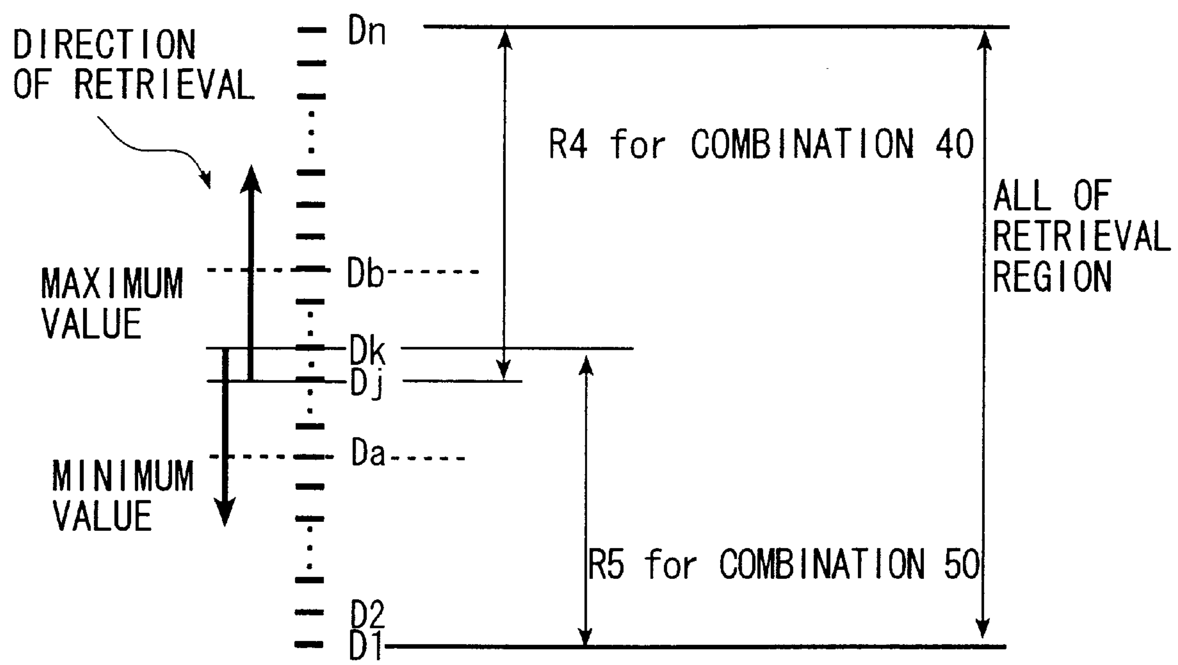
FIG. 14 is a modeled figure that shows the condition of the process of the electric potential detector 380 of the embodiment 2.

FIG. 13 is a circuit diagram that shows another example of the configuration of the electric potential detector 380 of the present embodiment. FIG. 14 is a modeled figure for explaining the function of the electric potential detector 390. The electric potential detector 380 shown in FIG. 13 has a configuration that comprises each pair of the latches 16, the D/A converters 18, and the comparators 14, which are comprised in the electric potential detector 380 of FIG. 4. The combination 40 that has a comparator 44, a D/A converter 48, and a latch 46 as constituents is provided for the range R4, which includes the maximum value within the whole retrieval range shown in FIG. 14. Similarly, the combination 50 that has a comparator 54, a D/A converter 58, and a latch 56 as constituents is provided for the range R5, which includes the minimum value.

In detail, the output of the sample hold circuit 12 is input to both of one of each of the input terminals of the comparators 44 and 54. The analog value of the data Dj–Dn is input to another input terminal of the comparator 44 through the latch 46 and the D/A converter 48. Similarly, the analog value of the data D1–Dk is input to the other input terminal of the comparator 54 through the latch 56 and the D/A converter 58.

During the pass/fail judgement, each of the maximum value and the minimum value are provided to each of the combinations 40 and 50, respectively, by the control circuit 10. The maximum value and the minimum value are used for the comparison with the electric potential V for each of the comparators 44 and 54 so that the pass/fail judgement is performed in parallel.

During the A/D conversion, the data Dj–Dn, which is included in the range R4 within the whole retrieval range of FIG. 14, is provided to the combination 40 one after another. On the other hand, the data Dk–D1, which is included in the range R5, is provided to the combination 50 one after another. As is clear from the above explanation, the A/D conversion is also performed for the range R4 and R5 in parallel by the combinations 40 and 50.

Here, as shown in FIG. 14, the value of a, j, k, and b are set to be "a≦j≦k≦b" as shown in FIG. 14, and thus "the data Dj, which is to be a starting point of the maximum value side<the data Dk, which is to be the starting point of the minimum value side". By the setting shown above, a part of the range R4 and R5 overlaps. This setting prevents the generation of the blank (the region where the process of the A/D conversion is not performed) from happening, which is caused within the whole retrieval region by the few differences of the characteristics between the comparators 44 and 54. In this way, the A/D conversion is performed for the whole retrieval region.

Furthermore, in the case where the analog value of the electric potential V exists just between the data Dj and Dk, there is a danger that two digital values, which are found from the comparison results that are obtained from each of the comparators 44 and 54, are different with each other. In this case, it is possible to adopt the configuration that sets the average value of two digital values to be a value of the electric potential V as an example.

The electric potential detector 380 of the present embodiment of FIG. 13 performs the pass/fail judgement and the A/D conversion at high speed by the above parallel configuration.

As is clear from the above explanation, according to the configuration of the embodiment 1 and 2, the inconsistency, which is caused between each of the results of the pass/fail judgement and the A/D conversion, can be avoided from occurring. Moreover, the pass/fail judgement can be performed at high speed in the case where only the pass/fail judgement is enough to be performed.

Although the present invention has been described with reference to specific embodiments, the scope of the present invention is not limited to these embodiments. Those skilled in the art can make various modifications and improvements to these embodiments of the present invention. It is clear from the appended claims that such modifications or improvements are also covered by the scope of the present invention.

Effect of Invention

According to the electric potential detector and the device tester of the present invention, no inconsistency arises between the judgement made by the judging means and the value of input electric potential found by the value determining means. Moreover, according to the method of detecting electric potential of the present invention, it is possible to retrieve the detailed value only when the input electric potential is "NO".

What is claimed is:

1. An electric potential detector, comprising:

a comparator that compares an input electric potential, which is an object to be detected, with a referential value and outputs a comparison result; and a control circuit that has:

a judgement means for performing a judgement of pass/fail of said input electric potential based on said comparison result obtained by providing an allowable limit value, which is a value indicating an allowable limit of said input electric potential, as said referential value; and a value determination means for finding a value of said input electric potential based on said comparison result obtained by providing said referential value to said comparator by varying said referential value.

2. An electric potential detector as claimed in claim 1, wherein:

said control circuit provides said comparator with a maximum value and minimum value of an allowable range of said input electric potential, which is said allowable limit value, as said referential value and judges that said input electric potential is a failure when said input electric potential is judged as higher than said maximum value or judged as lower than said minimum value by said comparator.

3. An electric potential detector as claimed in claim 1, wherein:

said value determination means detects a transition point of said comparison result by selecting a value from a plurality of candidate values one after another arbitrarily as said referential value and determines a value of said input electric potential based on the candidate value that corresponds to said transition point.

4. An electric potential detector as claimed in claim 1, wherein:

said comparator includes a first and a second comparator which input respectively a maximum and a minimum value of an allowable range of said input electric potential, which is provided as said referential value; and said control circuit judges whether said input electric potential is allowable at a high potential side based on a comparison result of said first comparator and judges whether said input electric potential is allowable at a low potential side based on a comparison result of said second comparator.

5. An electric potential detector as claimed in claim 2, wherein:

said input electric potential is analog; and said judgement means provides said maximum value and said minimum value to said comparator at different timings; and said electric potential detector further comprises:

a retaining means that retains said input electric potential while said maximum value and said minimum value are provided to said comparator.

6. An electric potential detector as claimed in claim 3, further comprising: an input electric potential retain means for retaining said input electric potential during selection of a value from said plurality of candidate values one after another arbitrarily as said referential value.

7. A device tester, comprising:

a test pattern generator that generates an input test pattern, which is to be input to a device under test (DUT), and an expectation pattern, which is to be output from said DUT into which said input test pattern is input;

a device testing comparator for judging a propriety of said DUT according to whether an output pattern, which is output from said DUT according to said input test pattern that is input to said DUT, and said expectation pattern matches;

a power supply for supplying electric power to said DUT; and a terminal potential detecting circuit for detecting an electric potential of a terminal of said DUT; wherein: said terminal potential detecting circuit has:

a sample potential comparator for outputting a comparison result by comparing a sample electric potential, which is input for observing said electric potential of said terminal, with a referential electric potential;

a judging means for judging a pass/fail of said sample electric potential based on said comparison result obtained by providing an allowable limit potential, which is an electric potential that indicates an allowable limit of said sample electric potential, as said referential electric potential; and a control unit that includes a value determination means for finding a value of said sample electric potential based on said comparison result obtained by providing said referential electric potential to said sample potential comparator by varying said referential electric potential.

* * * * *